United States Patent [19]
Davidson

[11] Patent Number: 4,905,308
[45] Date of Patent: Feb. 27, 1990

[54] NOISE PARAMETER DETERMINATION METHOD

[75] Inventor: Andrew C. Davidson, Portland, Oreg.

[73] Assignee: Cascade Microtech, Inc., Beaverton, Oreg.

[21] Appl. No.: 333,633

[22] Filed: Apr. 5, 1989

[51] Int. Cl.[4] .......................... G01S 7/40; G01R 27/28
[52] U.S. Cl. ..................................... 455/226; 455/67; 324/613
[58] Field of Search ............. 330/2; 364/489; 455/67, 455/226; 324/158 T, 57 N, 57 R

[56] References Cited

U.S. PATENT DOCUMENTS

| | | | |
|---|---|---|---|
| 2,901,696 | 8/1959 | Mollfors | 324/57 N |
| 3,619,780 | 11/1971 | Hoeks | 324/57 N |
| 4,074,201 | 2/1978 | Lennon | 324/57 N |
| 4,232,398 | 11/1980 | Gould | 455/67 |
| 4,491,783 | 1/1985 | Sawayama | 455/226 |

OTHER PUBLICATIONS

"IRE Standards on Methods of Measuring Noise in Linear Twoports, 1959," Proceedings of the IRE, (Jan. 1960), pp. 60–68.

Lane, Richard P., "Determination of Device Noise Parameters," Proceedings of the IEEE, vol. 57, (Aug. 1969), pp. 1461–1462.

Adamian and Uhlir, "Simplified Noise Evaluation of Microwave Receivers," IEEE Transaction on Instrumentation and Measurement, vol. IM-22, No. 2, (Jun. 1973), pp. 181–182.

Primary Examiner—Reinhard J. Eisenzopf
Assistant Examiner—Jose M. Solis
Attorney, Agent, or Firm—Chernoff, Vilhauer, McClung & Stenzel

[57] ABSTRACT

A method of determining a receiver's noise parameters by measuring one noise power for a first source noise temperature and a plurality of noise powers for another source noise temperature, all at known different source reflection coefficients.

6 Claims, 2 Drawing Sheets

NOISE PARAMETER DETERMINATION METHOD

TECHNICAL FIELD

The present invention relates to measuring a receiver's noise performance. Specifically, the present invention concerns a method of determining a receiver's noise parameters.

BACKGROUND OF THE INVENTION

The noise FIG. F of a receiver varies as a function of the admittance $Y_S = G_S + jB_S$ of its input termination, or "source admittance," according to the equation $$F_S = F_{min} + \frac{R_n}{G_S} |Y_S - Y_{opt}|^2 \tag{1}$$

where $F_{min}$ is the minimum, or optimum, noise figure achievable through adjustment of the source admittance, $Y_{opt} = G_{opt} + jB_{opt}$ is the source admittance at which the minimum noise figure is produced, and $R_n$ is a positive parameter having the dimensions of resistance. The noise performance of a receiver may be characterized by specifying the four noise parameters $F_{min}$, $R_n$, and $Y_{opt} = G_{opt} + jB_{opt}$. It is well known that equation (1) may equivalently be written in terms of source impedance, source reflection coefficient, or other physically equivalent source quality. For further information concerning noise figure refer to "IRE Standards on Methods of Measuring Noise in Linear Two-ports, 1959," *Proceedings of the IRE* (Jan 1960), pp. 60-68.

A receiver's noise parameters can be determined by various methods. One method entails determining the receiver's noise figures for various known source admittances, searching for the minimum noise figure $F_{min}$. Once $F_{min}$ has been experimentally identified, the noise parameters $F_{min}$ and $Y_{opt} = G_{opt} + jB_{opt}$ are known. A measurement of the receiver's noise figure at another known source admittance allows the noise parameter $R_n$ to be calculated.

This method of determining a receiver's noise parameters by searching for $F_{min}$ has numerous drawbacks. It requires the input termination to be able to match the source admittance $Y_{opt}$ at which the minimum noise figure $F_{min}$ is produced, requiring an input termination which is finely tunable over a wide range of admittances. The accuracy of the determined noise parameters is dependent on accurately locating the source admittance $Y_{opt}$ at which the minimum noise figure is produced. If the bottom of the surface defined by equation (1), given above, has relatively little curvature, then locating $Y_{opt}$ is difficult. Also, if the surface defined by equation (1) has steep slopes near the minimum noise figure, the minimum noise figure $F_{min}$ may be inaccurate. This searching method can require considerable time.

Noise figure is not directly measurable, but can be calculated from two noise power measurements taken at different noise source temperatures according to the equation $$F = \frac{ENR}{Y - 1} \tag{2}$$

where ENR is the excess noise ratio and Y is the ratio $P_{HOT}/P_{COLD}$ where $P_{HOT}$ and $P_{COLD}$ are measured noise powers at HOT and COLD source noise temperatures, respectively. The accuracy of the resulting noise figure depends on the total receiver gain remaining constant between measurements of $P_{HOT}$ and $P_{COLD}$, which requires that the source admittance $Y_S$ not change with the effective temperature of the source. Thus, a HOT source admittance must equal the respective COLD source admittance over a wide frequency band. In addition, the effective ENR of the source at the input of the receiver must be known for all the measured source admittances. Furthermore, if, as is common, an adjustable two-port tuner is used between the noise source and the receiver input to set the source admittance to various values, its loss must be known for each of the settings used in the noise power measurements.

Lane describes a technique for determining the four noise parameters from four or more noise figure determinations. Richard Q. Lane, "Determination of Device Noise Parameters," *Proceedings of the IEEE*, Vol. 57, (Aug. 1969), pp. 1461-62. Through the use of more than four noise figure determinations, and a fitting procedure, such as least-squares analysis, the noise parameters can be found while minimizing the effects of random measurement errors. However, like the previously described method, this technique requires multiple determinations of noise figure, with its associated measurement problems.

Another method of determining a receiver's noise parameters described by Adamian and Uhlir in "Simplified Noise Evaluation of Microwave Receivers," *IEEE Transaction on Instrumentation and Measurement*, Vol. IM-22, No. 2 (June 1973), pp. 181-82, requires only one noise figure measurement at an arbitrary source admittance and a plurality of noise power measurements for various other source admittances. Thus, any problems associated with determining noise figure are decreased in that only one noise figure need be determined. Unfortunately, the problems still exist for that one determination.

What is needed, then is an improved method for accurately determining a receiver's noise parameters without having to determine its noise figure for any source admittance.

SUMMARY OF THE INVENTION

The present invention provides a method for determining a receiver's noise parameters without having to determine a noise figure, thus overcoming the above-mentioned shortcomings and drawbacks of the previously available methods of determining noise parameters.

In accordance with the present invention, a receiver's noise power is measured for a plurality of known source admittances at a first source noise temperature. From these measurements, the admittance $Y_{opt}$ at which the minimum noise figure $F_{min}$ is produced may be determined, as well as both $F_{min}$ and $R_n$ being multiplied by the same constant k. Another measurement of noise power for a different source admittance and at a different noise temperature allows for calculation of the constant k.

It is therefore a principal object of the present invention to provide an accurate method for determining a receiver's noise parameters.

It is another object of the present invention to provide a method for determing a receiver's noise parameters without determining a noise figure.

The foregoing and other objectives, features and advantages of the present invention will be more readily understood upon consideration of the following detailed description of the invention taken in conjunction with the accompanying drawings.

DETAILED DESCRIPTION OF THE INVENTION

Figure 1:
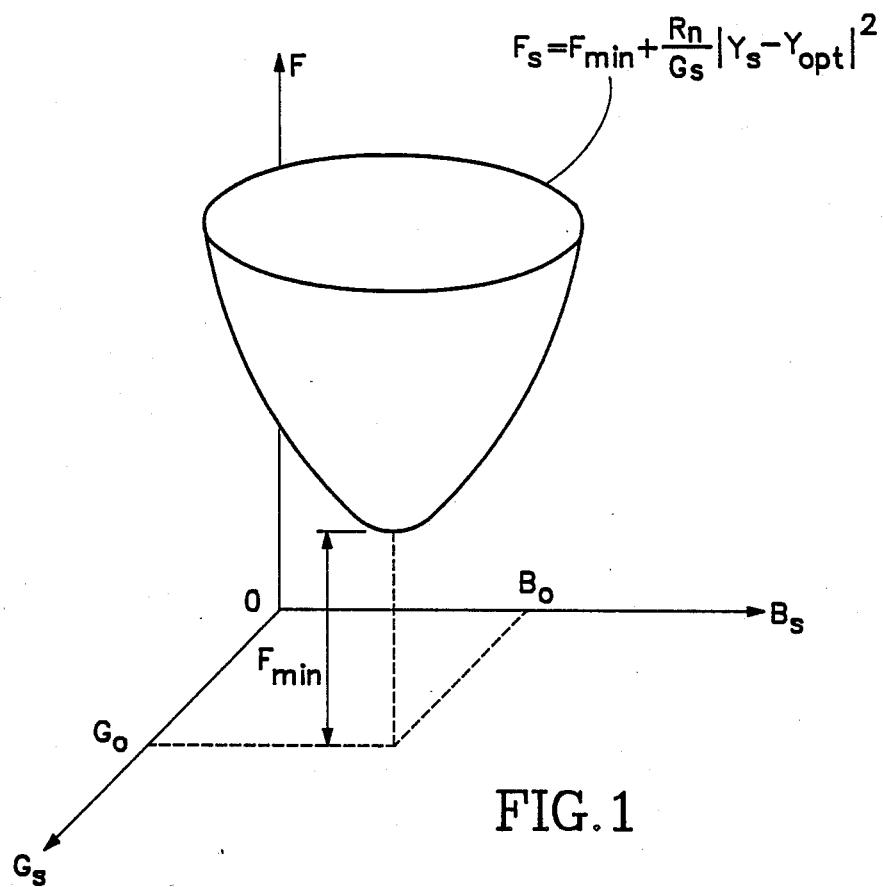
FIG. 1 is three-dimensional graph of noise FIG. F as a function of the source termination's admittance.

Referring to FIG. 1, a graph of a receiver's noise figure $F_s$ as a function of its source admittance $Y_S = G_S + jB_S$ is shown. The shape and location of this curve surface is defined by the four noise parameters $F_{min}$, $R_n$, and $Y_{opt} = G_{opt} + jB_{opt}$.

Figure 2:
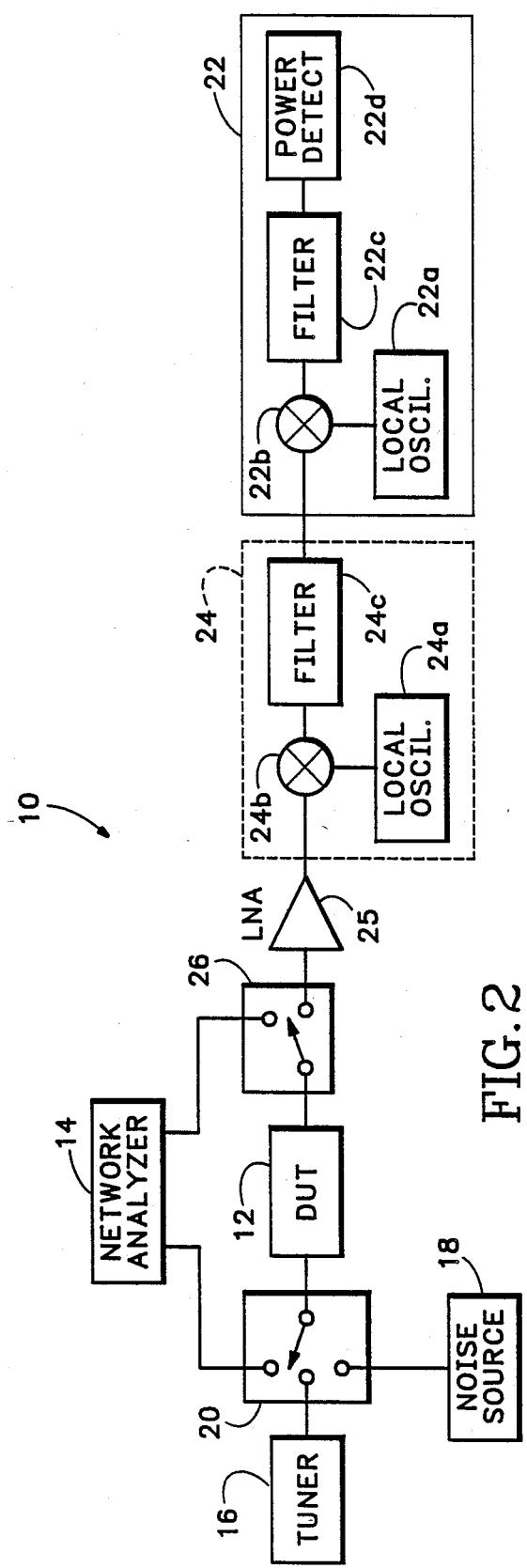
FIG. 2 is a block diagram of an exemplary system which may be used in determining a receiver's noise parameters.

Referring to FIG. 2, an exemplary measurement system 10 for use in determining the noise performance of a device under test (DUT) 12 is shown. The system includes a network analyzer 14, a one-port tuner 16, and a noise source 18. An input box 20 includes a three-position switch for selectively connecting the DUT's input alternatively to the network analyzer, or one of the input terminations, i.e., the noise source 18 or the one-port tuner 16. The system also includes a noise power meter 22 and may include a frequency conversion stage 24 and a low noise amplifier 25. An output box 26 includes a two-position switch for selectively connecting the DUT's output to either the network analyzer or the noise power meter (via the low noise amplifier and the frequency conversion stage, if present). The input and output boxes 20 and 22 also contain circuitry to bias the DUT for proper operation.

The frequency conversion stage 24 includes a local oscillator 24a, a mixer 24b, and a bandpass filter 24c for shifting noise signal frequency components of interest to within the input range of the noise power meter 22. The noise power meter 22 also typically includes one or more frequency conversion stages which contain a local oscillator 22a, a mixer 22b, and a filter 22c. The noise power meter's last frequency conversion stage is connected to a power detector 22d.

The input and output boxes 20, 26 allow the network analyzer 14 to be easily connected to various components of the measurement system. The input box also allows the DUT 12 to be connected to a choice of input terminations, either the one-port tuner 16 or the noise source 18. One skilled in the art will recognize the disclosed method for measuring noise parameters need not be identical to that shown in FIG. 1. Two-port tuners connected between the DUT and the noise source may be used. Also, the switches in the input boxes may be eliminated, their function being replaced by manually changing the connections.

The noise power meter 22 does not directly measure the DUT's noise performance. Rather, the power detector 22d senses all noise power, whether produced by the noise source 18, the tuner 16, the DUT 12, or any of the circuitry interposed between the DUT and the power detector. As used herein, "receiver" will denote all circuitry between the source termination and the power detector 22d, exclusive of the source termination and power detector. The relationship between the total noise figure for a pair of devices and the individual devices' noise figures is known. Thus, one skilled in the art will recognize this method may be used to determine the noise characteristics of both the receiver including the DUT, and with the DUT replaced by "through", allowing the noise characteristics of the DUT alone to be determined.

The ratio $g_S$ of receiver gain $G_S$ for a given source reflection coefficient $\Gamma_S$ to that receiver gain $G_{ref}$ for a perfectly matched source where $\Gamma_S = 0$ is given by the equation $$g_S = \frac{G_S}{G_{ref}} = \frac{1 - |\Gamma_S|^2}{|1 - \Gamma_S \cdot \Gamma_L|^2} \quad (3)$$

where $\Gamma_L$ is the receiver input reflection coefficient. The ratio $g_S$ is the "relative gain" for the given admittance. The ratio $g_S$ may also be given by the equation $$g_S = \frac{(P_{HOT} - P_{COLD})_S}{(P_{HOT} - P_{COLD})_{ref}} \quad (4)$$

where $P_{HOT}$ and $P_{COLD}$ are measured noise power for HOT and COLD source temperatures, respectively.

The noise figure for any source admittance $Y_S$, as stated above in equation (2), is given by the equation $$F_S = \frac{ENR}{Y - 1} = \frac{ENR \cdot (P_{COLD})_S}{(P_{HOT} - P_{COLD})_S} \quad (5)$$

where $Y$ is the ratio $P_{HOT}/P_{COLD}$.

From equations (4) and (5), the ratio of a noise figure $F_1$ to a noise figure $F_2$ determined for source reflection coefficients $\Gamma_1$ and $\Gamma_2$, respectively, is given by the equation $$\frac{F_1}{F_2} = \frac{(P_{COLD})_1}{(P_{COLD})_2} \cdot \frac{g_2}{g_1} = \frac{(P_{COLD}/g)_1}{(P_{COLD}/g)_2} \quad (6)$$

As stated above in equation (1), a receiver's noise figure depends on the source admittance according to the equation $$F_S = F_{min} + \frac{R_n}{G_S} |Y_S - Y_{opt}|^2. \quad (7)$$

If $F_S$ is scaled by a factor $k$, equation (7) becomes $$kF_S = kF_{min} + \frac{kP_n}{G_S} |Y_S - Y_{opt}|^2. \quad (8)$$

The parameters $F_{min}$ and $R_n$ are scaled by the same factor while the source admittance which produces $F_{min}$ remains unchanged.

Rewriting equation (6) to express the ratio of the noise figures $F_i$ at various known source admittances to the noise figure $F_0$ at some chosen reference source admittance yields the equation $$F_i \cdot \frac{(P_{COLD}/g)_0}{F_0} = (P_{COLD}/g)_i. \quad (9)$$

Since the quantities concerning the chosen reference source admittance will remain constant for each of the noise figures $F_i$, equation (9) can be rewritten as $$kFphd\ i = (P_{cold}/g): \quad (10)$$

where k is a constant, which is to say that noise figure is proportional to the quantity $P_{COLD}/g$, that is, the ambient noise power divided by the relative gain. The respective values $g_i$ can be calculated from network analyzer measurements using equation (3). The ratios $(P_{COLD}/g)_i$ then will fit equation (8) to provide values $Y_0$, $kF_{min}$ and $kR_n$.

From equations (9) and (10), the scale factor k is $$k = \frac{(P_{COLD}/g)_0}{F_0} \quad (11)$$

which, along with equations (4) and (6), yields the equation $$K = \left[\frac{P_{HOT} - P_{COLD}}{g}\right]_0 \cdot \frac{1}{ENR} \quad (12)$$

where $g_0$ is now the relative gain for the source reflection coefficient produced by the HOT source. Thus, $$k = [(P_{HOT}/g)_0 - (P_{COLD}/g)_0] \cdot \frac{1}{ENR} \quad (13)$$

where ENR is the HOT source calibration, $(P_{COLD}/g)_0 = kF_0$ is found from the four constants of equation (8) for the source admittance $Y_S$ produced by the HOT source, and $P_{HOT}$ is a new noise power measurement with the HOT source.

Once the scale factor k has been found, the known scaled noise parameters $kF_{min}$ and $kR_n$ can be converted to $F_{min}$ and $R_n$. The previously calculated $Y_0$ needs no conversion.

One skilled in the art will recognize that a plurality of noise power measurements at a first source noise temperature, combined with a plurality of noise power measurement at a second source noise temperature, will also provide the four noise parameters according to the disclosed method. There is no limitation that the first source noise temperature be the HOT measurement and the plurality of measurements be COLD measurements. Typically it is more difficult to take consistent HOT measurements. Thus, in the preferred embodiment, only one HOT measurement is taken, allowing the plurality of measurements to be taken at COLD, or ambient temperature.

Further, it will be appreciated by those skilled in the art that the described technique may be used to determine noise parameter regardless of whether the source termination is characterized in terms of source admittance, source impedance, source reflection, or other equivalent source quality.

The terms and expressions which have been employed in the foregoing specification are used therein as terms of description and not of limitation, and there is no intention, in the use of such terms and expressions, of excluding equivalents of the features shown and described or portions thereof, it being recognized the scope of the invention is defined and limited only by the claims which follow.

What is claimed is:

1. A method of determining the four parameters of a noise characterization equation which describes a receiver's noise performance as a function of the receiver's source termination, comprising the steps of:
   (a) measuring the receiver's noise power for each of four different known source terminations having a first noise temperature, and thereby determining a set of first noise power measurements;
   (b) measuring the receiver's noise power for a further known source termination having a second noise temperature, and thereby determining another noise power measurement;
   (c) determining a respective relative gain for each of said source terminations;
   (d) determining a respective ratio for each of said set of first noise power measurements to said respective relative gains;
   (e) substituting each of said respective ratios in said noise characterization equation, and thereafter calculating the four parameters in a form where two of said parameters are scaled by a constant; and
   (f) utilizing said further noise power measurement to determine said constant.

2. The method of claim 1 wherein said noise equation describes the receiver's noise performance as a function of the receiver's source termination described in terms of admittance.

3. The method of claim 1 wherein said noise equation describes the receiver's noise performance as a function of the receiver's source termination described in terms of impedance.

4. The method of claim 1 wherein said noise equation describes the receiver's noise performance as a function of the receiver's source termination described in terms of reflection coefficient.

5. The method of claim 1 wherein said first noise temperature is equal to an ambient temperature.

6. A method of determining the parameters of the noise equation $F_S = F_{min} + (R_n/G_S) \cdot |Y_S - Y_{opt}|^2$ which describes a receiver's noise performance as a function of the receiver's source admittance $Y_S$, comprising the steps of:
   (a) measuring the receiver's noise power for each of four different known source terminations having a first noise temperature, resulting in a set of first noise power measurements;
   (b) measuring the receiver's noise power for a second noise temperature, resulting in another noise power measurement;
   (c) determining a respective relative gain for each of said source terminations;
   (d) determining a respective ratio for each of said set of first noise power measurements to said respective, relative gains;
   (e) substituting each of said respective ratios in said noise characterization equation, and thereafter calculating the parameters $Y_{opt} = G_S + jB_S$, and the parameters $F_{min}$ and $R_n$ scaled by a constant k; and
   (f) utilizing said further noise power measurement to determine said constant.

* * * * *

UNITED STATES PATENT AND TRADEMARK OFFICE
CERTIFICATE OF CORRECTION

PATENT NO. : 4,905,308

DATED : February 27, 1990

INVENTOR(S) : Andrew C. Davidson

It is certified that error appears in the above-identified patent and that said Letters Patent is hereby corrected as shown below:

Col. 4, line 55   Change "$\frac{kPn}{G_s}$" to -- $\frac{kRn}{G_s}$ --

Col. 5, line 5    Change "kFphd i = $(P_{cold}/g)$:" to -- $kF_i = (P_{cold}/g)_i$ --

Signed and Sealed this

Eleventh Day of June, 1991

Attest:

HARRY F. MANBECK, JR.

*Attesting Officer*   *Commissioner of Patents and Trademarks*